United States Patent
Ko et al.

(10) Patent No.: US 8,609,463 B2
(45) Date of Patent: Dec. 17, 2013

(54) INTEGRATED CIRCUIT PACKAGE SYSTEM EMPLOYING MULTI-PACKAGE MODULE TECHNIQUES

(75) Inventors: WonJun Ko, Ichon-si (KR); SeungYun Ahn, Ichon-si (KR); DongSoo Moon, Ichon-si (KR)

(73) Assignee: Stats Chippac Ltd., Singapore (SG)

(*) Notice: Subject to any disclaimer, the term of this patent is extended or adjusted under 35 U.S.C. 154(b) by 1075 days.

(21) Appl. No.: 11/687,357

(22) Filed: Mar. 16, 2007

(65) Prior Publication Data
US 2008/0227238 A1    Sep. 18, 2008

(51) Int. Cl.
*H01L 25/065*    (2006.01)
*H01L 25/18*    (2006.01)

(52) U.S. Cl.
USPC ........... 438/108; 438/109; 438/107; 438/122; 438/125; 438/617; 257/777; 257/686; 257/738; 257/778; 257/780

(58) Field of Classification Search
USPC .......... 257/686, 723, 784, E25.013, E25.023, 257/E25.029, 777, 738, 778, 780, 783, 257/E21.705; 438/107–109, 122, 125, 617
See application file for complete search history.

(56) References Cited

U.S. PATENT DOCUMENTS

| | | | |
|---|---|---|---|
| 5,397,747 A * | 3/1995 | Angiulli et al. | 438/109 |
| 6,861,288 B2 * | 3/2005 | Shim et al. | 438/109 |
| 7,045,887 B2 * | 5/2006 | Karnezos | 257/686 |
| 2004/0104469 A1 * | 6/2004 | Yagi et al. | 257/723 |
| 2004/0195667 A1 * | 10/2004 | Karnezos | 257/686 |
| 2006/0249851 A1 | 11/2006 | Karnezos | |
| 2006/0284299 A1 | 12/2006 | Karnezos | |

* cited by examiner

*Primary Examiner* — Zandra Smith
*Assistant Examiner* — Tsz Chiu
(74) *Attorney, Agent, or Firm* — Ishimaru & Associates LLP; I-Chang John Yang (57) ABSTRACT

An integrated circuit package system that includes: providing a first package including a first package first device and a first package second device both adjacent a first package substrate; and mounting and electrically interconnecting a second package over an electrical interconnect array formed on a substrate of the first package second device.

18 Claims, 5 Drawing Sheets

INTEGRATED CIRCUIT PACKAGE SYSTEM EMPLOYING MULTI-PACKAGE MODULE TECHNIQUES

TECHNICAL FIELD

The present invention relates generally to integrated circuits, and more particularly to an integrated circuit package system employing multi-package module techniques.

BACKGROUND ART

Integrated circuits and integrated circuit package systems can be found in a multitude of portable electronic devices, such as cellphones, pocket PCs, digital cameras and other wireless products. Today's customers and electronics systems are demanding that these integrated circuit systems provide maximum functional integration of memory and logic within the smallest footprint, lowest profile, and lowest cost package available. Consequently, manufacturer's are turning to three-dimensional packaging to achieve the required high level of functional integration necessary to support these mobile multimedia products.

Various techniques, such as, stacked-die-packages (SDP), stacked packages (SP), and multi-package-modules (MPM), have been developed to meet the continued demands for improving functional integration. Although stacked-die-packaging and stacked packaging techniques can minimize a devices footprint area, the profile height and the package interconnections of SDP and SP methods can become a limiting factor as the circuit density of the package increases. Furthermore, although MPM techniques improve circuit density and package level functional integration, they often suffer from an increased profile thickness, a larger footprint area, and complicated fabrication methods. Commonly, these complicated fabrication methods can lead to increased production costs, which can make a product prohibitively expensive.

Thus, a need still remains for a reliable integrated circuit package system and method of fabrication, wherein the integrated circuit package system exhibits a high level of functional integration, decreased package size, and ease of manufacturability. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a first package including a first package first device and a first package second device both adjacent a first package substrate; and mounting and electrically interconnecting a second package over an electrical interconnect array formed on a substrate of the first package second device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the package substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The terms "first", "second", and "third" as used herein are for purposes of differentiation between elements only and are not to be construed as limiting the scope of the present invention.

Figure 1:
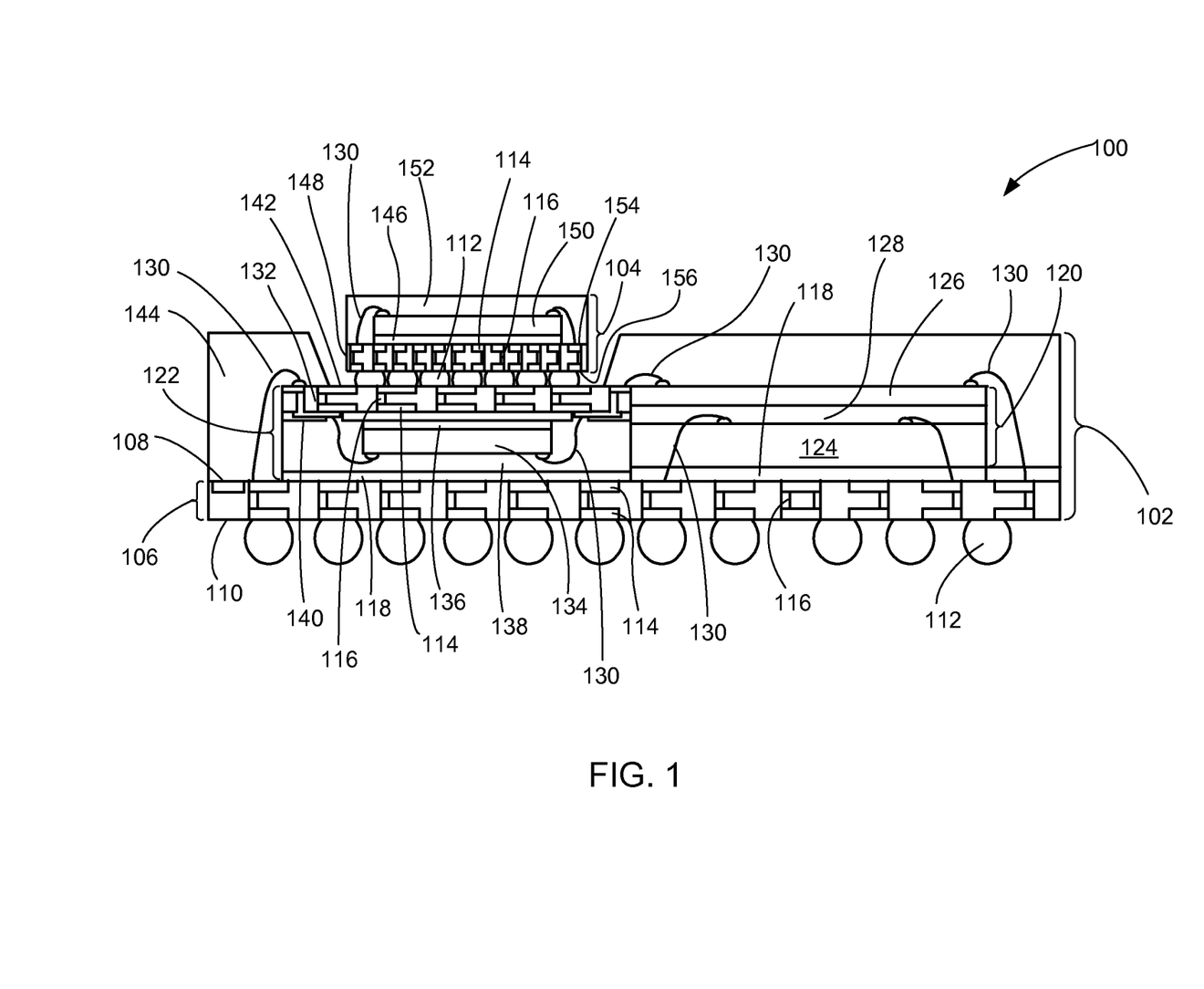
FIG. 1 is a cross sectional view of an integrated circuit package system in accordance with an embodiment of the present invention.

Referring now to FIG. 1, therein is shown a cross sectional view of an integrated circuit package system 100 in accordance with an embodiment of the present invention. The integrated circuit package system 100 may include a first package 102 and a second package 104, for example. As an exemplary illustration, the integrated circuit package system 100 may generally be used within a portable electronics device that requires a high level of functional integration, such as a cellphone or computer. Furthermore, by way of example, the integrated circuit package system 100 may be referred to as a side fan in package on package structure.

The first package 102 may further include a first package substrate 106 with a first surface 108 positioned opposing a second surface 110. The first package substrate 106 may include a thin metal sheet, a conductive plated pattern on plastic tape, a semiconductor substrate or any multi-layer structure (e.g. —a laminate with one or more metal layers) suitable for electrically interconnecting integrated circuit systems formed on the first surface 108 of the first package substrate 106 to external electrical circuits.

However, it is to be understood that the present invention is not to be limited to these examples. In accordance with the invention, the first package substrate 106 may include any electrical interconnection structure that facilitates the incorporation of the integrated circuit package system 100 into a higher-level assembly, such as a printed circuit board or other suitable structure for supporting and/or electrically interfacing with the integrated circuit package system 100. As an exemplary illustration, the second surface 110 of the first package substrate 106 may be designed/engineered to electrically interface with another package structure, such as another one of the integrated circuit package system 100.

Moreover, it is to be understood that one or more of the integrated circuit package system 100 can be prepared at one time on the first package substrate 106, which could then be separated into individual or multiple semiconductor assemblies (i.e. —more than one of the integrated circuit package system 100) at a later stage of fabrication.

A terminal 112, such as a solder ball formed as part of a ball grid array structure, can be formed on the second surface 110 of the first package substrate 106. The terminal 112 provides an electrical interface or interconnection between the integrated circuit package system 100 and external electrical circuits. More specifically, an electrical trace system 114 receives an electrical signal from the terminal 112 and transmits the electrical signal between the second surface 110 and the first surface 108 through a via 116. Although the present embodiment depicts the terminal 112 as a solder ball, it is to be understood that the terminal 112 may include any interface connection technology, such as a pin or land grid array, that establishes electrical contact between the integrated circuit package system 100 and external electrical circuits.

An intra-package structure 118 is formed over the first surface 108 of the first package substrate 106. The intra-package structure 118 may include an adhesive with or without thermally conducting capabilities, a spacer, an electromagnetic interference shield for blocking potentially disruptive energy fields, or a combination thereof.

Mounted over the intra-package structure 118 are a first package first device 120 abutting a first package second device 122. The first package first device 120 may include a first die 124 stacked under a second die 126. The first die 124 and the second die 126 may include semiconductor chips selected from active components, passive components, processor components, memory components, logic components, digital components, analog components, power components, and so forth, in numerous configurations and arrangements as may be needed. As exemplary illustrations, the first die 124 and the second die 126 may more specifically include a digital signal processor, an application specific integrated circuit, a graphical processor unit, flash memory, dynamic random access memory (DRAM), magnetic random access memory (MRAM), static random access memory (SRAM), an optical sensor device, a micro-electro-mechanical device, a radio frequency (RF) device, and/or a combination thereof.

It is to be understood that the design of the first package first device 120 covers a wide range of semiconductor chip configurations for the first die 124 and the second die 126, which may involve various chip sizes, chip dimensions, and the number of chips stacked; and, the type of chip configuration employed should only be limited by the design specifications of the integrated circuit package system 100. For example, the number of chips or die stacked within the first package first device 120 may include one or more and need only be limited by the required design profile thickness of the integrated circuit package system 100.

An intra-device structure 128 separates the first die 124 from the second die 126 and may include an adhesive with or without thermally conducting capabilities, a spacer, an electromagnetic interference shield for blocking potentially disruptive energy fields, or a combination thereof.

Notably, the present invention allows for testing of the first die 124 and the second die 126 before assembly into the integrated circuit package system 100, therefore ensuring the use of known good die in the manufacturing process.

The first die 124 is electrically connected to the electrical trace system 114 of the first package substrate 106 via an electrical connection 130, such as a wire bond. The second die 126 may also be electrically connected to the electrical trace system 114 of the first package substrate 106 via the electrical connection 130. Moreover, the second die 126 can be electrically attached via the electrical connection 130 to a substrate 132 of the first package second device 122 formed adjacent the first package first device 120.

Uniquely, by forming the first package second device 122 adjacent the first package first device 120, the close proximity of the substrate 132 to the second die 126 decreases the in-line process cycle time of the integrated circuit package system 100 by reducing the amount of time needed to form some of the electrical connection 130. For example, the electrical connection 130 formed between the second die 126 and the substrate 132 eliminates some of the electrical connection 130 formed between the second die 126 and the electrical trace system 114 of the first package substrate 106, which require a longer in-line process cycle time due to the increased length of the electrical connection 130. In at least one embodiment, by forming the first package second device 122 next to the first package first device 120, the substrate 132 of the first package second device 122 can abut the first) package first device 120.

Additionally, since the first package second device 122 is not stacked over the first package first device 120, as in a conventional fan in package on package structure, the complexity of the wire bonding process for the electrical connection 130 is reduced. By reducing the complexity of the wire bonding process for the integrated circuit package system 100, the in-line process cycle time for the integrated circuit package system 100 can be improved (i.e. —reduced).

Furthermore, the close proximity of the first package second device 122 to the first package first device 120 helps to reduce the overall footprint of the integrated circuit package system 100. The footprint of the integrated circuit package system 100 is reduced because the offset distance required between the first package second device 122 and the first package first device 120, due to the formation of a wire bond connection from the second die 126 to the first package substrate 106, has been eliminated.

Notably, the first package second device 122 includes an inverted package design, such as an inverted chip scale package or an inverted internal stacking module device, mounted over the first package substrate 106. By mounting the first package second device 122 directly over (e.g. —without an intervening package or device) the first package substrate 106, it becomes possible to reduce the overall profile or height of the integrated circuit package system 100. Additionally, by mounting the first package second device 122 directly over the first package substrate 106 without an intervening package or device, the ease of manufacturing can be enhanced due to the reduction in wiring complexity of such a simplified structure.

The first package second device 122 includes the electrical trace system 114, the via 116, the electrical connection 130, the substrate 132, a die 134, an intra-device structure 136, and an encapsulation material 138. The electrical connection 130, such as a wire bond, connects: the die 134 to the electrical trace system 114 of the substrate 132, the first package second device 122 to the electrical trace system 114 of the first package substrate 106, and the substrate 132 to the second die 126 of the first package first device 120.

The intra-device structure 136 offsets the die 134 from the substrate 132 and may include an adhesive with or without thermally conducting capabilities, a spacer, an electromagnetic interference shield for blocking potentially disruptive energy fields, or a combination thereof.

The die 134 may include semiconductor chips selected from active components, passive components, processor components, logic components, digital components, analog components, memory components, power components, and so forth, in numerous configurations and arrangements as may be needed. As an exemplary illustration, the die 134 may more specifically include a digital signal processor, an application specific integrated circuit, a graphical processor unit, flash memory, DRAM, MRAM, SRAM, an optical sensor device, a micro-electro-mechanical device, an RF device, and/or a combination thereof.

It is to be understood that the design of the first package second device 122 covers a wide range of semiconductor chip configurations, which may involve various chip sizes, chip dimensions, and the number of chips (e.g. —a chip stack configuration of logic and memory devices); and, the type of chip configuration employed should only be limited by the design specifications of the integrated circuit package system 100. For example, the number of chips or the die 134 within the first package second device 122 may include one or more (e.g. —in a stacked configuration) and need only be limited by the required design profile thickness of the integrated circuit package system 100.

The substrate 132 may include a thin metal sheet, a conductive plated pattern on plastic tape, a semiconductor substrate or any multi-layer structure (e.g. —a laminate with one or more metal layers) suitable for supporting and/or electrically interconnecting integrated circuit systems formed on a first surface 140 and on a second surface 142 of the substrate 132.

By way of example, the electrical trace system 114 formed on the first surface 140 of the substrate 132 can be designed to accommodate the electrical connection 130 from the die 134. Further, by way of example, the electrical trace system 114 formed on the second surface 142 of the substrate 132 can be designed to accommodate the electrical connection 130 from the second die 126 and from the first package substrate 106. Additionally, by way of example, the electrical trace system 114 formed on the second surface 142 of the substrate 132 can also be designed to include an electrical interconnect array 200, of FIG. 2 (described further below).

Figure 2:
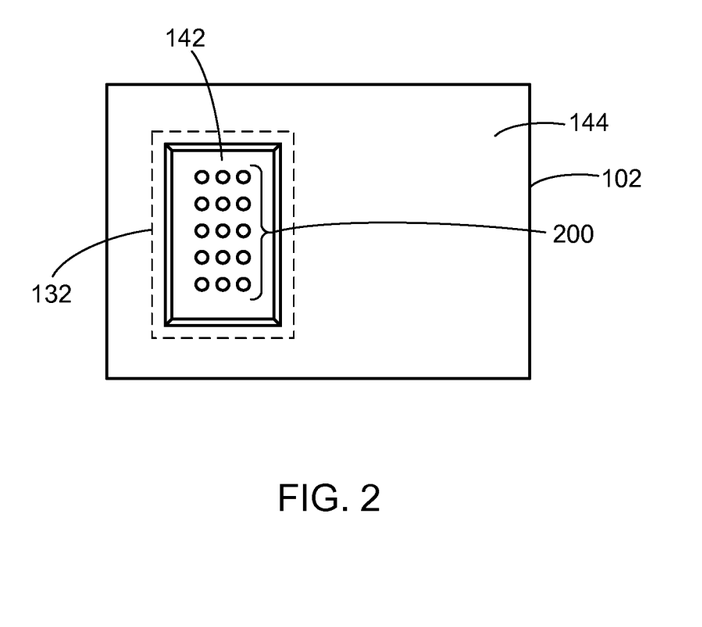
FIG. 2 is a top view of the structure of FIG. 1 without the second package formed thereover, in accordance with an embodiment of the present invention.

The electrical interconnect array 200, such as a land grid array, can be substantially centrally located within an exposed portion of the second surface 142 of the substrate 132. The exposed portion of the second surface 142 is defined by a first package encapsulation material 144, which forms a cavity around the electrical interconnect array 200 while protecting the electrical connection 130 formed along the periphery of the substrate 132.

The second package 104 is mounted over or onto the first package second device 122 of the first package 102 and may include a chip scale package or a stacked die chip scale package, for example. In at least one embodiment, the second package 104 can be mounted directly onto the first package second device 122 (e.g., mounted directly onto the substrate 132 of the first package second device 122). The second package 104 includes the terminal 112, the electrical trace system 114, the via 116, the electrical connection 130, the intra-device structure 146, a second package substrate 148, a second package die 150, and a second package encapsulation material 152. The terminal 112 of the second package 104 electrically interconnects the second package 104 to the electrical interconnect array 200 of the first package second device 122. As an exemplary illustration, the terminal 112 may include a solder ball formed as part of a ball grid array or as part of a center ball grid array.

The electrical connection 130, such as a wire bond, connects the second package die 150 to the electrical trace system 114 of the second package substrate 148.

The intra-device structure 146 offsets the second package die 150 from the second package substrate 148 and may include an adhesive with or without thermally conducting capabilities, a spacer, an electromagnetic interference shield for blocking potentially disruptive energy fields, or a combination thereof.

The second package die 150 may include semiconductor chips selected from active components, passive components, processor components, logic components, digital components, analog components, memory components, power components, and so forth, in numerous configurations and arrangements as may be needed. As an exemplary illustration, the second package die 150 may more specifically include a digital signal processor, an application specific integrated circuit, a graphical processor unit, flash memory, DRAM, MRAM, SRAM, an optical sensor device, a micro-electro-mechanical device, an RF device, and/or a combination thereof.

It is to be understood that the design of the second package 104 covers a wide range of semiconductor chip configurations, which may involve various chip sizes, chip dimensions, and the number of chips (e.g. —a chip stack configuration of logic and memory devices); and, the type of chip configuration employed should only be limited by the design specifications of the integrated circuit package system 100. For example, the number of chips or die within the second package 104 may include one or more (e.g. —in a stacked configuration) and need only be limited by the required design profile thickness of the integrated circuit package system 100.

The second package substrate 148 may include a thin metal sheet, a conductive plated pattern on plastic tape, a semiconductor substrate or any multi-layer structure (e.g. —a laminate with one or more metal layers) suitable for supporting and/or electrically interconnecting integrated circuit systems formed on a first surface 154 of the second package substrate 148 to external electrical circuits, such as the first package second device 122 of the first package 102.

By way of example, the electrical trace system 114 formed on the first surface 154 of the second package substrate 148 can be designed to accommodate the electrical connection 130 from the second package die 150. Additionally, by way of example, the electrical trace system 114 formed on a second surface 156 of the second package substrate 148 can be designed to electrically interface with the electrical interconnect array 200 of the first package second device 122 through the terminal 112.

Although the present embodiment depicts only one of the second package 104 formed over the first package second device 122, it is to be understood that two or more of the second package 104 could be mounted side-by-side or in a stacked configuration over the first package second device 122.

Additionally, each of the first package 102 and the second package 104 can be electrically tested to verify conformance to specifications before stacking. Consequently, the yield of a final stacked multi-package module, such as the integrated circuit package system 100, can be maximized.

In accordance with the scope of the present invention, it is to be understood that the overall profile or height of the integrated circuit package system 100 can be controlled by employing thin and ultra-thin components within the first package 102 and the second package 104.

Referring now to FIG. 2, therein is shown a top view of the structure of FIG. 1 without the second package 104, of FIG. 1, formed thereover, in accordance with an embodiment of the present invention. The second package 104 has been removed to more clearly depict the electrical interconnect array 200 formed on the second surface 142 of the substrate 132 (depicted in dashed outline) of the first package 102.

The electrical trace system 114, of FIG. 1, formed on the second surface 142 of the substrate 132 may include the electrical interconnect array 200. The electrical interconnect array 200, such as a land grid array, can be substantially centrally located within an exposed portion of the second surface 142 that is defined by the first package encapsulation material 144. As an exemplary illustration, the electrical interconnect array 200 may include a 3×5 array of electrical interconnects. However, it is to be understood that the design, size and number of the electrical interconnect array 200 is not critical, what is important is that the electrical interconnect array 200 provides an electrical interface between the second package 104 and the first package second device 122, of FIG. 1.

Notably, the configuration of the electrical interconnect array 200 enables free device stacking (e.g.—stacking of the second package 104) with a center ball array. Conventionally, package over package stacking has been limited to peripherally located electrical contacts because the semiconductor chip has occupied the center portion of the semiconductor substrate. It has been discovered by the present inventors that by inverting a package structure, such as the first package second device 122, that the electrical interconnect array 200 contact design can be employed, which provides significant flexibility in selecting the package to be stacked, and, therefore in the kinds of functions that can be integrated. Furthermore, the electrical interconnect array 200 can provide a very fine pitch between electrical contacts because the solder ball height and its corresponding diameter increase need not account for the height of the semiconductor chip that conventionally occupies the center portion of the semiconductor substrate.

Figure 3:
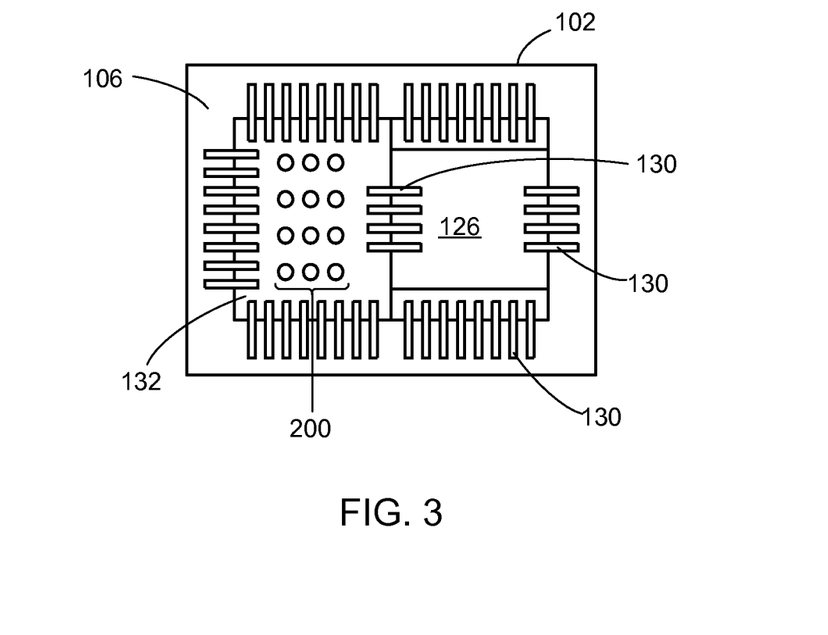
FIG. 3 is a top view of the structure of FIG. 1 without the second package and the first package encapsulation material formed thereover, in accordance with an embodiment of the present invention.

Referring now to FIG. 3, therein is shown a top view of the structure of FIG. 1 without the second package 104 and the first package encapsulation material 144, each of FIG. 1, formed thereover, in accordance with an embodiment of the present invention. The second package 104 and the first package encapsulation material 144 have been removed to more clearly depict the bond design of the electrical interconnect array 200 and the electrical connection 130 of the first package 102. This view depicts an exemplary bond design diagram, wherein the location, pattern, and number of the electrical connection 130 and the electrical interconnect array 200 are for purposes of illustration and are not to be construed as limiting.

The first package 102 includes the first package substrate 106, the second die 126, the electrical connection 130, the substrate 132, and the electrical interconnect array 200. Notably, this view clearly depicts the electrical connection 130 between the substrate 132 and the second die 126, which helps to reduce the footprint of the first package 102 and the in-line process cycle time devoted to forming the electrical connection 130. The electrical connection 130 also connects the second die 126 and the substrate 132 to the first package substrate 106.

Figure 4:
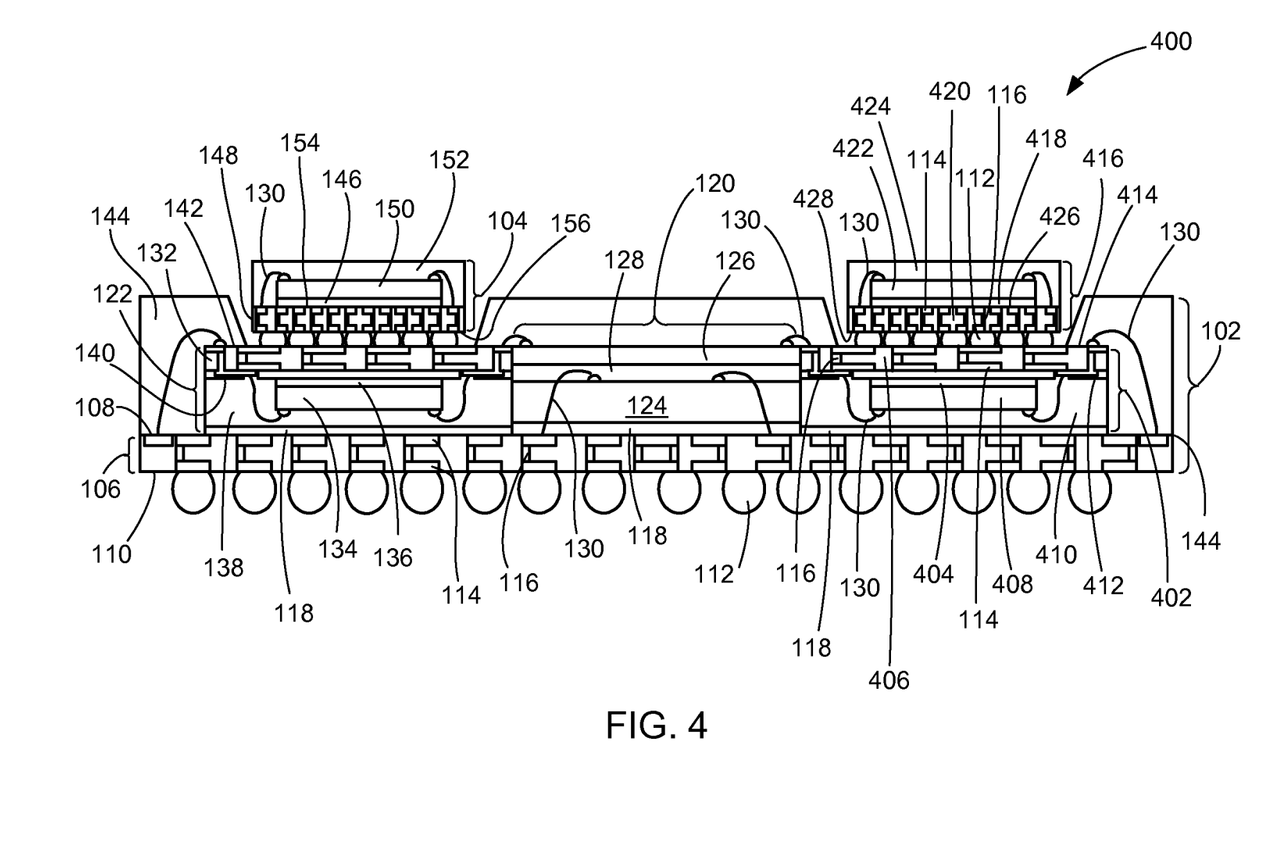
FIG. 4 is a cross sectional view of an integrated circuit package system in accordance with another embodiment of the present invention.
Figure 5:
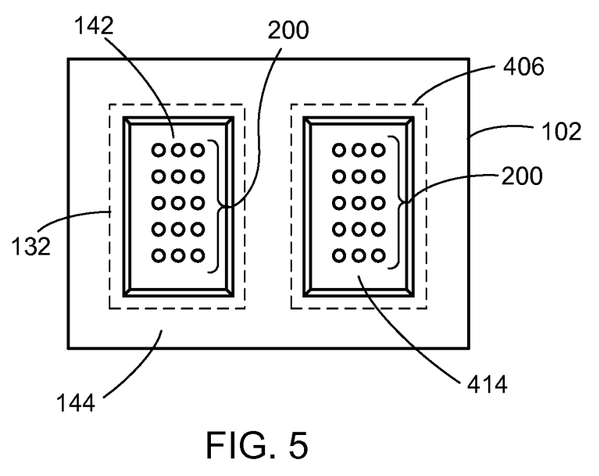
FIG. 5 is a top view of the structure of FIG. 4 without the second package and the third package formed thereover, in accordance with an embodiment of the present invention.
Figure 6:
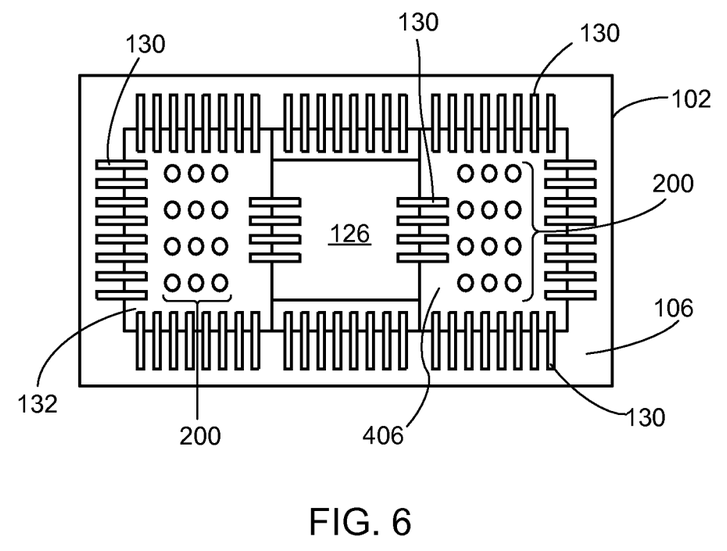
FIG. 6 is a top view of the structure of FIG. 4 without the second package, the third package, and the first package encapsulation material formed thereover, in accordance with an embodiment of the present invention.

Referring now to FIGS. 4-6. FIGS. 4-6 depict similar configurations as to that shown in FIGS. 1-3, and consequently, only the differences between the figures will be described, to avoid redundancy.

FIG. 4 depicts a cross sectional view of an integrated circuit package system 400 in accordance with another embodiment of the present invention. The integrated circuit package system 400 includes the first package 102, the second package 104, the first package substrate 106, the first surface 108, the second surface 110, the terminal 112, the electrical trace system 114, the via 116, the intra-package structure 118, the first package first device 120, the first package second device 122, the first die 124, the second die 126, the intra-device structure 128, the electrical connection 130, the substrate 132, the die 134, the intra-device structure 136, the encapsulation material 138, the first surface 140, the second surface 142, the first package encapsulation material 144, the intra-device structure 146, the second package substrate 148, the second package die 150, the second package encapsulation material 152, the first surface 154, and the second surface 156.

As an exemplary illustration, the integrated circuit package system 400 may generally be used within a portable electronics device that requires a high level of functional integration, such as a cellphone or computer. Furthermore, by way of example, the integrated circuit package system 400 may be referred to as a multi fan in package on package structure.

The integrated circuit package system 400 also includes the first package third device 402 mounted over the first package substrate 106. The first package third device 402 can be formed adjacent the first package first device 120. Stated another way, the first package first device 120 can be formed abutting, between, and substantially coplanar with the first package second device 122 and the first package third device 402. In at least one embodiment, the first package first device 120 can be formed abutting and substantially coplanar with the substrate 132 of the first package second device 122 and a substrate 406 of the first package third device 402.

The first package third device 402 may include an inverted package design, such as an inverted chip scale package or an inverted internal stacking module device. By mounting the first package third device 402 directly over (e.g.—without an intervening package or device) the first package substrate 106, it becomes possible to reduce the overall profile or height of the integrated circuit package system 400. Additionally, by mounting the first package third device 402 directly over the first package substrate 106 without an intervening package or device, the ease of manufacturing can be enhanced due to the reduction in wiring complexity of such a simplified structure.

The first package third device 402 includes the electrical trace system 114, the via 116, the electrical connection 130, an intra-device structure 404, the substrate 406, a die 408, and an encapsulation material 410. The electrical connection 130, such as a wire bond, connects: the die 408 to the electrical trace system 114 of the substrate 406, the first package third device 402 to the electrical trace system 114 of the first package substrate 106, and the substrate 406 to the second die 126 of the first package first device 120.

The intra-device structure 404 offsets the die 408 from the substrate 406 and may include an adhesive with or without thermally conducting capabilities, a spacer, an electromagnetic interference shield for blocking potentially disruptive energy fields, or a combination thereof.

The die 408 may include semiconductor chips selected from active components, passive components, processor components, logic components, digital components, analog components, memory components, power components, and so forth, in numerous configurations and arrangements as may be needed. As an exemplary illustration, the die 408 may more specifically include a digital signal processor, an application specific integrated circuit, a graphical processor unit, flash memory, DRAM, MRAM, SRAM, an optical sensor device, a micro-electro-mechanical device, an RF device, and/or a combination thereof.

It is to be understood that the design of the first package third device 402 covers a wide range of semiconductor chip configurations, which may involve various chip sizes, chip dimensions, and the number of chips (e.g. —a chip stack configuration of logic and memory devices); and, the type of chip configuration employed should only be limited by the design specifications of the integrated circuit package system 400. For example, the number of chips or the die 408 within the first package third device 402 may include one or more (e.g. —in a stacked configuration) and need only be limited by the required design profile thickness of the integrated circuit package system 400.

The substrate 406 may include a thin metal sheet, a conductive plated pattern on plastic tape, a semiconductor substrate or any multi-layer structure (e.g. —a laminate with one or more metal layers) suitable for supporting and/or electrically interconnecting integrated circuit systems formed on a first surface 412 and on a second surface 414 of the substrate 406.

By way of example, the electrical trace system 114 formed on the first surface 412 of the substrate 406 can be designed to accommodate the electrical connection 130 from the die 408. Further, by way of example, the electrical trace system 114 formed on the second surface 414 of the substrate 406 can be designed to accommodate the electrical connection 130 from the second die 126 and from the first package substrate 106. Additionally, by way of example, the electrical trace system 114 formed on the second surface 414 of the substrate 406 can also be designed to include the electrical interconnect array 200, of FIGS. 5 and 6 (described further below).

The electrical interconnect array 200, such as a land grid array, can be substantially centrally located within an exposed portion of the second surface 414 of the substrate 406. The exposed portion of the second surface 414 is defined by the first package encapsulation material 144, which forms a cavity around the electrical interconnect array 200 while protecting the electrical connection 130 formed along the periphery of the substrate 406.

A third package 416 is mounted over the first package third device 402 of the first package 102 and may include a chip scale package or a stacked die chip scale package, for example. The third package 416 includes the terminal 112, the electrical trace system 114, the via 116, the electrical connection 130, an intra-device structure 418, a third package substrate 420, a third package die 422, and a third package encapsulation material 424. The terminal 112 of the third package 416 electrically interconnects the third package 416 to the electrical interconnect array 200 of the first package third device 402. As an exemplary illustration, the terminal 112 may include a solder ball formed as part of a ball grid array.

The electrical connection 130, such as a wire bond, connects the third package die 422 to the electrical trace system 114 of the third package substrate 420.

The intra-device structure 418 offsets the third package die 422 from the third package substrate 420 and may include an adhesive with or without thermally conducting capabilities, a spacer, an electromagnetic interference shield for blocking potentially disruptive energy fields, or a combination thereof.

The third package die 422 may include semiconductor chips selected from active components, passive components, processor components, logic components, digital components, analog components, memory components, power components, and so forth, in numerous configurations and arrangements as may be needed. As an exemplary illustration, the third package die 422 may more specifically include a digital signal processor, an application specific integrated circuit, a graphical processor unit, flash memory, DRAM, MRAM, SRAM, an optical sensor device, a micro-electro-mechanical device, an RF device, and/or a combination thereof.

It is to be understood that the design of the third package 416 covers a wide range of semiconductor chip configurations, which may involve various chip sizes, chip dimensions, and the number of chips (e.g. —a chip stack configuration of logic and memory devices); and, the type of chip configuration employed should only be limited by the design specifications of the integrated circuit package system 400. For example, the number of chips or die within the third package 416 may include one or more (e.g. —in a stacked configuration) and need only be limited by the required design profile thickness of the integrated circuit package system 400.

The third package substrate 420 may include a thin metal sheet, a conductive plated pattern on plastic tape, a semiconductor substrate or any multi-layer structure (e.g. —a laminate with one or more metal layers) suitable for supporting and/or electrically interconnecting integrated circuit systems formed on a first surface 426 of the third package substrate 420 to external electrical circuits, such as the first package third device 402 of the first package 102.

By way of example, the electrical trace system 114 formed on the first surface 426 of the third package substrate 420 can be designed to accommodate the electrical connection 130 from the third package die 422. Additionally, by way of example, the electrical trace system 114 formed on a second surface 428 of the third package substrate 420 can be designed to electrically interface with the electrical interconnect array 200 of the first package third device 402 through the terminal 112.

Although the present embodiment depicts only one of the third package 416 formed over the first package third device 402, it is to be understood that two or more of the third package 416 could be mounted side-by-side or in a stacked configuration over the first package third device 402.

Additionally, each of the first package 102, the second package 104, and the third package 416 can be electrically tested to verify conformance to specifications before stacking. Consequently, the yield of the final stacked multi-package module, such as the integrated circuit package system 400, can be maximized.

In accordance with the scope of the present invention, it is to be understood that the overall profile or height of the integrated circuit package system 400 can be controlled by employing thin and ultra-thin components within the first package 102, the second package 104 and the third package 416.

Referring now to FIG. 5, therein is shown a top view of the structure of FIG. 4 without the second package 104, of FIG. 4, and the third package 416, of FIG. 4, formed thereover, in accordance with an embodiment of the present invention. The second package 104 and the third package 416 have been removed to more clearly depict the electrical interconnect array 200 formed on the substrate 132 (depicted in dashed outline) and the substrate 406 (depicted in dashed outline).

The electrical trace system 114, of FIG. 4, formed on the second surface 142 of the substrate 132 and on the second surface 414 of the substrate 406 may include the electrical interconnect array 200. The electrical interconnect array 200, such as a land grid array, can be substantially centrally located within exposed portions of the second surface 142 and the second surface 414, which are defined by the first package encapsulation material 144. As an exemplary illustration, each of the electrical interconnect array 200 may include a 3×5 array of electrical interconnects. However, it is to be understood that the design, size and number of the electrical interconnect array 200 is not critical, what is important is that each of the electrical interconnect array 200 provides an interface for electrically connecting the second package 104 and the third package 416 to the first package 102.

Notably, the configuration of the electrical interconnect array 200 enables free device stacking (e.g. —stacking of the second package 104 and the third package 416) with a center ball array. Conventionally, package over package stacking has been limited to peripherally located electrical contacts because the semiconductor chip has occupied the center portion of the semiconductor substrate. It has been discovered by the present inventors that by inverting a package structure, such as the first package second device 122 and the first package third device 402, both of FIG. 4, that the electrical interconnect array 200 contact design can be employed, which provides significant flexibility in selecting the packages to be stacked, and, therefore in the kinds of functions that can be integrated. Furthermore, the electrical interconnect array 200 can provide a very fine pitch between electrical contacts because the solder ball height and its corresponding diameter increase need not account for the height of the semiconductor chip that conventionally occupies the center portion of the semiconductor substrate.

Referring now to FIG. 6, therein is shown a top view of the structure of FIG. 4 without the second package 104, the third package 416, and the first package encapsulation material 144, each of FIG. 4, formed thereover, in accordance with an embodiment of the present invention. The second package 104, the third package 416, and the first package encapsulation material 144 have been removed to more clearly depict the bond design of the electrical interconnect array 200 and the electrical connection 130 of the first package 102. This view depicts an exemplary bond design diagram, wherein the location, pattern, and number of the electrical connection 130 and the electrical interconnect array 200 are for purposes of illustration and are not to be construed as limiting.

The first package 102 includes the first package substrate 106, the second die 126, the electrical connection 130, the substrate 132, the electrical interconnect array 200, and the substrate 406. Notably, this view clearly depicts the electrical connection 130 between the second die 126 and the substrate 132 and the substrate 406, which helps to reduce the footprint of the first package 102 and the in-line process cycle time devoted to forming the electrical connection 130. The electrical connection 130 also connects the second die 126, the substrate 132, and the substrate 406 to the first package substrate 106.

Figure 7:
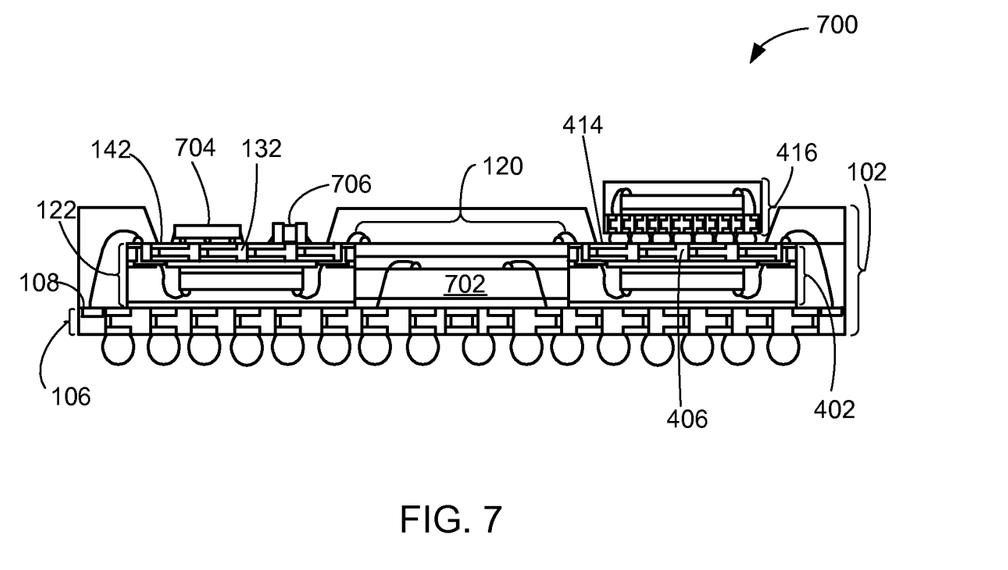
FIG. 7 is a cross sectional view of an integrated circuit package system in accordance with another embodiment of the present invention.

Referring now to FIG. 7. FIG. 7 depicts a similar configuration as to that shown in FIG. 4, and consequently, only the differences between the figures will be described, to avoid redundancy.

FIG. 7 depicts a cross sectional view of an integrated circuit package system 700 in accordance with another embodiment of the present invention. The integrated circuit package system 700 includes the first package 102, the third package 416, a flip-chip die 702, a flip-chip device 704, and a passive device 706. As an exemplary illustration, the integrated circuit package system 700 may generally be used within a portable electronics device that requires a high level of functional integration, such as a cellphone or computer. Furthermore, by way of example, the integrated circuit package system 700 may be referred to as a multi fan in package on package structure employing flip-chip and passive components.

This embodiment utilizes flip-chip structures, such as the flip-chip die 702 and the flip-chip device 704, to increase the circuit density of the integrated circuit package system 700. As an exemplary illustration, the circuit density of the integrated circuit package system 700 is increased because the area array technology employed by the flip-chip die 702 provides a greater number of input/output leads than conventional wirebonding perimeter array techniques.

The flip-chip die 702 can be used in place of the first die 124, of FIGS. 1 and 4, of the first package first device 120. The flip-chip die 702 can be mounted with the active side facing the first surface 108 of the first package substrate 106. The flip-chip die 702 can be electrically connected to the first package substrate 106 by bumps or balls.

The flip-chip device 704 and/or the passive device 706 can be used in place of the second package 104, of FIG. 4. Per this embodiment, the flip-chip device 704 and/or the passive device 706 are representative of the second package 104. The flip-chip device 704 can be mounted with the active side facing the second surface 142 of the substrate 132 of the first package second device 122. The flip-chip device 704 can be electrically connected to the first package second device 122 by bumps or balls. As an exemplary illustration, the passive device 706 may include components, such as resistors and capacitors and can also be electrically connected to the first package second device 122 by bumps or balls.

Although the present embodiment depicts the flip-chip device 704 and the passive device 706 formed over the second surface 142 of the substrate 132 (i.e. —over the first package second device 122), it is to be understood that the flip-chip device 704 and the passive device 706 can be formed over either or both of the second surface 142 of the substrate 132 or the second surface 414 of the substrate 406 (i.e. —over the first package third device 402). Additionally, it is to be understood that one or more of the flip-chip device 704 and/or the passive device 706 can be formed over either or both of the first package second device 122 or the first package third device 402.

Uniquely, the second surface 142 of the substrate 132 and the second surface 414 of the substrate 406 each include the electrical interconnect array 200, of FIGS. 5 and 6.

In accordance with the scope of the present invention, it is to be understood that the overall profile or height of the integrated circuit package system 400 can be controlled by employing thin and ultra-thin components within the first package 102, the second package 104 and the third package 416

Figure 8:
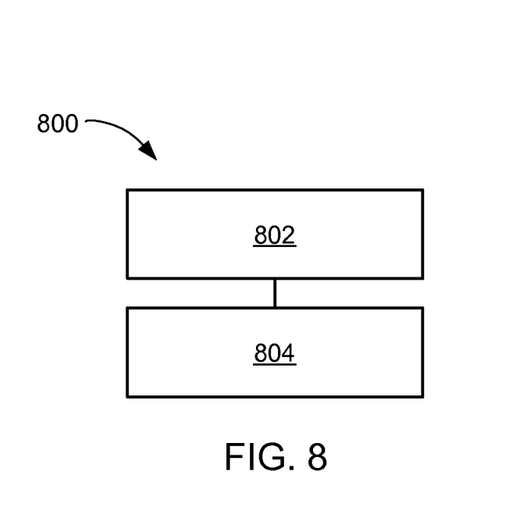
FIG. 8 is a flow chart of an integrated circuit package system for an integrated circuit package system in accordance with an embodiment of the present invention.

Referring now to FIG. 8, therein is shown a flow chart of an integrated circuit package system 800 for the integrated circuit package system 100, 400 and 700 in accordance with an embodiment of the present invention. The integrated circuit package system 800 includes providing a first package including a first package first device and a first package second device both adjacent a first package substrate in a block 802; and mounting and electrically interconnecting a second package over an electrical interconnect array formed on a substrate of the first package second device in a block 804.

It has been discovered that the present invention thus has numerous aspects. One such aspect is that the present invention enables free memory stacking with center ball grid arrays for the second package and/or the third package. By inverting the first package second device and the first package third device, their respective substrates can be formed to include a land grid array that can accommodate center ball grid array mounts.

Another aspect is that the first package second device and the first package third device can be mounted directly over the first package substrate, thereby, reducing the total package height and providing an easy assembly/attach process. Additionally, the first package second device and the first package third device can be formed adjacent the first package first device, thereby, reducing the footprint of the package structure.

Another aspect is that the in-line process cycle time can be reduced because it is now possible to wire bond the second die of the first package first device to the substrate of the first package second device and/or the substrate of the first package third device.

Another aspect of the present invention is that flip-chip structures can be employed to increase the circuit density within the package.

Another aspect of the present invention is that the integrated circuit package system offers high design flexibility. For example, the packages, the devices, and the die utilized by the present invention can be standard in the industry, thereby, providing potential solutions with the lowest cost and widest availability. By utilizing standard components within the integrated circuit package system, significant flexibility can be had in selecting the components to be integrated, and therefore, in the kinds of functions that can be utilized in the packaging assembly.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for increasing functional integration while reducing the profile thickness and footprint area of a package. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    providing a package substrate;
    forming a first package over the package substrate, the first package including:
        a first device having a first die and a second die, the first die being closer to the package substrate,
        a second device having an encapsulation material and a device substrate, the encapsulation material being closer to the package substrate,
        wherein the first device is adjacent the second device such that the second die of the first device abuts the device substrate of the second device;
    forming an electrical interconnect array on the device substrate; and
    mounting and electrically interconnecting a second package over the electrical interconnect array.

2. The method as claimed in claim 1 wherein:
    forming the first package over the package substrate includes the second device being an inverted chip scale package with a land grid array.

3. The method as claimed in claim 1 wherein:
    mounting and electrically interconnecting the second package includes electrically interconnecting the second package with a ball grid array.

4. The method as claimed in claim 1 further comprising:
    forming an electrical connection between the second die of the first device and the device substrate of the second device.

5. A method of manufacture of an integrated circuit package system comprising:
    providing a package substrate;
    forming a first package over the package substrate, the first package including
        an interior device having a first die and a second die, the first die being closer to the package substrate,
        a first device having a first encapsulation material and a first device substrate, the first encapsulation material being closer to the package substrate,
        a second device having a second encapsulation material and a second device substrate, the second encapsulation material being closer to the package substrate,
        wherein the interior device is situated between the first device and the second device such that the second die of the interior device abuts the first device substrate of the first device and the second device substrate of the second device,
    mounting and electrically interconnecting a second package directly onto the first device; and
    mounting and electrically interconnecting a third package directly onto the second device.

6. The method as claimed in claim 5 wherein:
mounting and electrically interconnecting the second package includes mounting the second package onto the first device substrate of the first device; and
mounting and electrically interconnecting the third package includes mounting the third package onto the second device substrate of the second device.

7. The method as claimed in claim 5 further comprising:
forming an electrical connection between the second die of the interior device and the first device substrate of the first device and the second device substrate of the second device.

8. The method as claimed in claim 5 further comprising:
configuring each of the second package and the third package to include a passive device and a flip-chip device.

9. The method as claimed in claim 5 wherein:
mounting and electrically interconnecting the second package and mounting and electrically interconnecting the third package includes mounting each of the second package and the third package with a center ball grid array.

10. An integrated circuit package system comprising:
a package substrate;
a first package over the package substrate, the first package including:
  a first device having a first die and a second die, the first die being closer to the package substrate,
  a second device having an encapsulation material and a device substrate, the encapsulation material being closer to the package substrate,
  wherein the first device is adjacent the second device such that the second die of the first device abuts the device substrate of the second device; and
a second package over an electrical interconnect array formed on the device substrate.

11. The system as claimed in claim 10 wherein:
the second device includes an inverted chip scale package.

12. The system as claimed in claim 10 wherein:
the electrical interconnect array formed on the device substrate of the second device includes a land grid array.

13. The system as claimed in claim 10 wherein:
the second package is electrically connected to the second device by a ball grid array.

14. The system as claimed in claim 10 further comprising:
an electrical connection between the second die and the device substrate of the second device.

15. The system as claimed in claim 10 wherein:
the integrated circuit package system includes a combination of processor devices and memory devices.

16. The system as claimed in claim 10 further comprising:
a third device adjacent the first device, the third device having a device substrate, wherein the second die of first device abuts the device substrate of the third device; and
a third package over an electrical interconnect array formed on the device substrate of the third device.

17. The system as claimed in claim 16 further comprising:
an electrical connection between the second die of the first device and the device substrate of the second device and the device substrate of the third device.

18. The system as claimed in claim 16 wherein:
each of the second package and the third package includes a passive device and a flip-chip device.

* * * * *